United States Patent
Pahl (10) Patent No.: US 7,102,224 B2
(45) Date of Patent: Sep. 5, 2006

(54) ENCAPSULATED COMPONENT AND METHOD FOR THE PRODUCTION THEREOF

(75) Inventor: Wolfgang Pahl, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/527,932

(22) PCT Filed: Oct. 15, 2003

(86) PCT No.: PCT/EP03/11448

§ 371 (c)(1),
(2), (4) Date: Mar. 16, 2005

(87) PCT Pub. No.: WO2004/044980

PCT Pub. Date: May 27, 2004

(65) Prior Publication Data

US 2006/0043601 A1    Mar. 2, 2006

(30) Foreign Application Priority Data

Nov. 14, 2002   (DE)   .............................. 102 53 163

(51) Int. Cl.
H01L 23/12   (2006.01)
H01L 23/544  (2006.01)
H01L 21/00   (2006.01)
H01L 21/46   (2006.01)

(52) U.S. Cl. .................. 257/704; 257/678; 257/723; 257/710; 257/620; 257/E23.128; 257/E23.193; 438/33; 438/68; 438/107; 438/113; 438/460; 438/462

(58) Field of Classification Search ................. 257/704, 257/710, 730, 731, 773, 924, E23.128, E21.118, 257/E23.193, E21.05, E21.501, 678, 527, 257/594, 618–622, E21.122, E21.567, E21.57; 438/33, 68, 107, 113, 460–465; 148/33–33.3
See application file for complete search history.

(56) References Cited

U.S. PATENT DOCUMENTS

| 3,615,913 | A | * | 10/1971 | Shaw ........................ 148/33.3 |
| 4,040,874 | A | * | 8/1977 | Yerman ..................... 148/33.3 |
| 5,300,812 | A | | 4/1994 | Lupinski et al. |
| 5,334,874 | A | | 8/1994 | Metzler et al. |
| 5,987,732 | A | | 11/1999 | Lee et al. |
| 6,777,767 | B1 | * | 8/2004 | Badehi ....................... 257/432 |
| 2004/0237299 | A1 | | 12/2004 | Stelzl et al. |

FOREIGN PATENT DOCUMENTS

CA       2399417       8/2002

(Continued)

Primary Examiner—Jasmine Clark
(74) Attorney, Agent, or Firm—Fish & Richardson P.C.

(57) ABSTRACT

A component includes a chip having a first chip face and a second chip face, where the first chip face includes component structures and connector metallizations associated with the component structures. The component also includes a frame structure on the first chip face and adjacent to the component structures, and a cover over the frame structure. The cover has a first cover face and a second cover face. The first cover face is closer to the chip than the second cover face. A back metallization is on the second chip face, on sides of the frame structure, and on sides of the cover. A contact is on the second cover face. There is a connection through the cover, which electrically connects the component structures and the contact. The connection is metallized and sealed.

22 Claims, 3 Drawing Sheets

FOREIGN PATENT DOCUMENTS

| | | |
|---|---|---|
| DE | 100 06 446 | 8/2001 |
| DE | 101 36 743 | 2/2003 |
| EP | 0759231 | 12/1998 |
| WO | WO95/30276 | 11/1995 |
| WO | WO00/35085 | 6/2000 |
| WO | WO01/43181 | 6/2001 |
| WO | WO01/59827 | 8/2001 |
| WO | WO02/103784 | 6/2002 |

* cited by examiner

ENCAPSULATED COMPONENT AND METHOD FOR THE PRODUCTION THEREOF

This application is a 371 of PCT/EP03/11448 Oct. 15, 2003.

TECHNICAL FIELD

The invention relates to a component having microelectronic components including MEMS and MEOMS—microelectronic/(optical)/mechanical systems—having a hermetic encapsulation and a wafer level packaging for this component, in which an optimal hermetic seal in the sense of a moisture diffusion seal is produced.

BACKGROUND

For almost four decades, the integration density in microelectronics has been following "Moore's Law," which states a doubling approximately every 18 months, with simultaneous halving of the production costs. Traditionally, the production of microelectronic products has been divided into the so-called front end (essentially application and structuring of thin films on wafers) and, after these are sawed into individual chips, the so-called back end (assembly of the chips on carriers, electrical contacting, and enclosure or enveloping).

The mechanical and electrical connections of the chip to the carrier are brought together into a single step with the flip-chip technique. In this way, significant miniaturization and better signal transmission due to low inductance values is made possible by means of this connection technique.

The combination of flip-chip assembly with a utilization technique in which a plurality of chips is mounted on a common carrier is particularly advantageous. In this manner, components are now being implemented whose footprint does not exceed the actual chip area required for active structures and connections by more than 20%, with the term chip sized package (CSP) being commonly used for this.

Lateral chip dimensions of approximately 1 mm are below dimensions where conventional housings ("tub" with lid) could be used. For these reasons, leading semiconductor manufacturers have developed packaging concepts in recent years, which provide for encapsulation on the wafer level, i.e., before individualization of the components, after wafer structuring.

A true wafer level packaging avoids the individual handling of individual chips. With this, the implementation of a true CSP is made possible even with very small chip dimensions. Fundamentally, all the housing functionalities can be implemented on the wafer level. Aside from the protection against mechanical and climatic influences, as well as the provision of electrical connections that are compatible with industry standards such as surface assembly and re-flow solders, re-wiring can also take place here, for example. In this connection, chip connectors can be freely positioned on the outside housing surface. This is made possible by means of one or more insulation layers, interfacial connections, and conductive structures. Internal connections are also possible in this manner.

The demand for true CSP is further emphasized by the pressure towards miniaturization and, to a particular degree, in the case of expensive substrates (e.g., LiTaO$_3$, GaAs).

For semiconductor components that do not require any housing cavity, on the basis of their method of functioning, there are a large number of appropriate concepts. Some of them have already become so broadly established that they are offered on the packaging of specialized service providers. An example is the method known under the trademark UltraCSP.

A fundamental technical problem of all solutions paths that have been proposed until now is the long-term reliability of the components, since the internal and external connections become fatigued due to temperature change stress. This must particularly be taken into account by means of coordinating the thermal expansion properties of the materials used.

The stated task is made even more difficult as soon as the demand for a housing cavity for the component structures is added, for example in the case of SAW (surface acoustic wave) components. Often, a hermetic seal in the sense of a diffusion seal of this cavity is also demanded, since otherwise the resistance to damp heat can be insufficient, resulting in corrosion, problems caused by condensate on active structures, problems with the moisture content of polymers used in soldering processes, etc.). A hermetic seal can fundamentally not be achieved with polymer-based molding masses, resins, or adhesives, since these materials are more or less permeable for gases and moisture, due to permeation processes.

In WO2000/3508A1, an active structure on a wafer is surrounded with a frame of photoresist, for example, onto which a circuit board is glued as a cover. Interfacial connections guide the electrical connectors from the chip to contacts on the circuit board. No sufficient hermetic seal is achieved with the sealing layer that covers the back of the chip as well as the side surfaces of the component, since the circuit board is not completely covered, because the usual resin laminates with fiber reinforcement recommended as the sealing layer are particularly disadvantageous in terms of their diffusion seal, since moisture can spread along the border layer between the polymer and the fibers. However, the decisive disadvantage is that the sealing layer described can no longer be applied on the wafer level, but only afterwards, on the individual component.

From WO2001/4318A1, another method for packaging is known. Here, the wafer is glued between two covers. Frame-shaped spacers define a cavity above the active chip structure, if necessary. The electrical contacts run around the chip to contacts (110) on the back cover, by means of metal structures that were originally produced on the wafer and those that are structured in sawed notches along the separation lines (108). The joining materials are polymers, with which no diffusion seal can be achieved, as was explained. The concept does not permit complete metallization (and therefore a seal), since the electrical connections require several metal structures that are electrically separated from one another.

It is therefore the task of the present invention to indicate a simple and cost-effective method for true CSP, on the wafer level, for SAW filters and other components, with which method components having a diffusion seal can be produced.

SUMMARY

This task is accomplished, in the present invention, with a component as recited in claim 1. A method for the production of the component, as well as advantageous embodiments of the invention, can be derived from additional claims.

The component according to the invention fulfills all of these requirements and is furthermore compatible with various technologies such as SAW and FBAR (=thin film bulk acoustic wave resonator). Furthermore, numerous applications are possible in microsystem technology, which is diversifying, and in integrated optics and sensor systems.

The invention indicates a component having a hermetic encapsulation, which has a sandwich-like glued structure. The structure comprises a chip, preferably made of a piezoelectric material, on the surface of which component structures and connection metallizations connected with them are implemented, a frame structure that surrounds the component structures in ring shape, as well as a diffusion-proof cover that forms a cavity for the component structures, resting on the frame structure and being rigidly connected with it. Furthermore, the component has a back face metallization that is applied to the back face of the chip and covers at least all of the surfaces of the sandwich-like structure that face towards the outside, at the edges of the component. This means that all of the layer transitions of the sandwich-like structure are covered with the back face metallization at their butt edges (outside edges of the component). The cover has contacts on the surface that are connected, in electrically conductive manner, with the component structures on the chip, using interfacial connections through the cover. The interfacial connections are guided through holes or recesses in the cover that are completely metallized on the inside surfaces, with an underside metallization, and thereby are sealed with a diffusion seal.

The component according to the invention has an improved hermetic encapsulation, since all of the potential leakage points of the component are provided with a sealed metallization. The metallization can be applied to the back face of the chip, over its entire area, and goes down past the butt edges of the border areas. The interfacial connections, which provide access to the interior of the encapsulation, are also securely sealed with an underside metallization. At the same time, it is ensured that the component requires only an insignificantly greater footprint than a naked chip (bare die), and therefore is suitable for the production of further miniaturized components. The structure that is actually already known, forming a closed cavity for the component structures, also allows a secure and contact-free encapsulation even of sensitive component structures. Such sensitive component structures are particularly known in the case of components that work with acoustic waves, such as SAW components, FBAR resonators, as well as in the case of numerous components of microtechnology, as well as in the case of integrated optical and opto-electronic applications, or in sensor systems.

In an advantageous embodiment of the invention, the frame structure surrounds the components structures in ring shape and, furthermore, forms branches or insulated islands that face inward. These surround another cavity within the sandwich-like structure, in which the connector metallizations are exposed on the surface of the chip. In this manner, it is possible to guide the interfacial connections through the cover, into these additional cavities, without the cavity with the component structures being opened. This also makes it possible to keep the component structures free of metallization during the production of the underside metallization, without additional efforts being required for this purpose, for seals or covers.

In another embodiment of the invention, another wiring level is provided within the sandwich-like structure, which is connected both with the connector metallization on the chip and with the contacts on the underside of the cover, by way of interfacial connections. In a simple embodiment, the wiring level can be applied on the frame structure. However, since, in the case of a miniaturized component, little additional space for the wiring level is available above the frame structure, this wiring level cannot be used for the production of complex circuitry, but it can be used to produce track crossings without any short circuit.

It is advantageous that in another embodiment of the invention, at least one intermediate layer is inserted between the frame structure and the cover as a wiring level, on which sufficient space is available for the wiring level, on its top or bottom. Then it is also possible to produce metal structures in the wiring level, with which both tracks and concrete passive component structures are implemented, which are wired to the component structures. Capacitors, inductors, and ohmic resistors are particular possibilities as concrete components.

The intermediate layer is preferably but not necessarily made of the same material as the frame structure. This guarantees a simple and reliable connection. Preferred materials for the frame structure and, if applicable, intermediate layers are a benzocyclobutene, a polyimide, or a benzoxazol. These materials have proven themselves to be particularly advantageous with regard to temperature stability, adhesion to ceramic and metallic layers, with regard to metallizability and structurability. These polymers are also available or can be produced in photo-sensitized versions, which can be structured by means of direct exposure. However, polyurethane (PU), epoxy resin, and acrylates are also suitable as the intermediate layer and frame structure.

The most important requirement for the diffusion-proof cover is its diffusion-proof structure. Furthermore, it is advantageous if the material has sufficient rigidity and mechanical strength. Therefore, ceramic, metal, and, in particular, glass are preferred as a material for the cover.

Since the at least one additional wiring level is preferably applied to a frame structure and/or to additional (organic) intermediate layers, the cover is preferably in one piece or in one layer. Fundamentally, it is also possible, in this way, to use a multi-layer cover, if the additional layers or their connections can be configured to be sufficiently diffusion-resistant. It is also possible to dispose a wiring level on the top of the cover, but in the component, this hardly differentiates the cover from a wiring level that is arranged on the intermediate layer.

In an advantageous embodiment, the cavity that surrounds the component structures is filled with a gas, e.g., a protective gas, in order to achieve specific break-through characteristics in case of over-voltage, which gas can raise or lower the break-through voltage. It is also possible to establish a dew point in this manner.

For the production and for the achievable seal, it is advantageous if the interfacial connections have a conical cross-section that narrows noticeably towards the interior, into the structure. It is also advantageous if the outside edges of the structure are slanted, so that, starting from the back face of the chip, by way of the frame structure, to the carrier, an increasing cross-section is obtained. A conical formation of the interfacial connections and slanted side edges facilitate the production of a sealed metallization, and thereby also improve the hermetic seal of the component interior. If the interfacial connections pass through additional layers, in addition to the cover, the openings for the interfacial connections are preferably disposed concentrically and are configured to be conical in all the layers.

In this connection, a component can comprise one or more individual functional units (in the case of SAW components, for example, "2 in 1" or "n in 1" filters), or can be structured in multi-layer technology or mixed technology. Such components, which can be configured on a common chip, can be integrated in simple manner. It is also possible that the component comprises hybrid structures, in which micromechanical, optical, and microelectronic or passive electronic components, for example, are integrated to form a component, or to form a component according to the invention.

In the following, the invention and, in particular, the method for the production of a component according to the invention, will be explained in greater detail, using exemplary embodiments and the related figures. The figures are only schematic, they are not true to scale, and they do not reproduce the correct size relationships.

DETAILED DESCRIPTION

Figure 1:
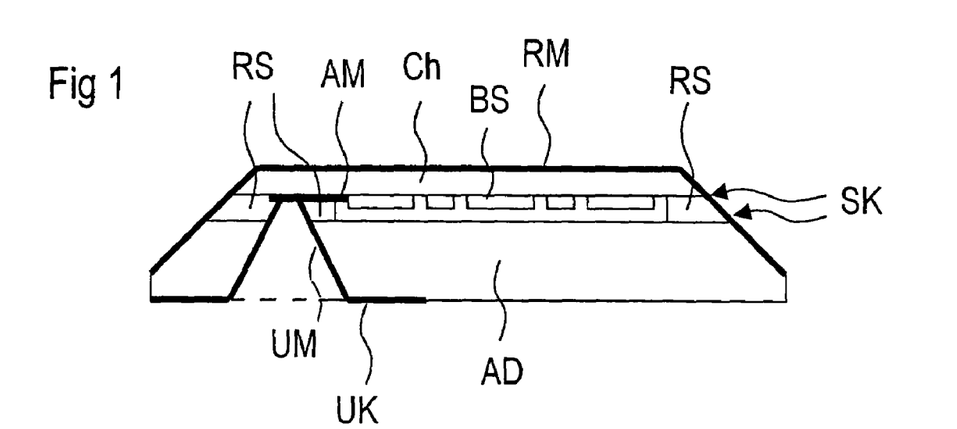
FIG. 1 shows a component according to the invention, in schematic cross-section.

FIG. 1 shows a component according to the invention, in schematic cross-section. The component has a sandwich-like structure, in which a chip CH provided on its front face with component structures BS, and a cover AD are glued together, a frame structure RS acting as a spacer. The component structures BS are disposed in a cavity between cover AD and chip CH. The side edges of the component are slanted on the chip side, and are provided with a back face metallization RM. Here, this covers the entire back face of the chip, and reaches as far as the region of the side edges of the cover AD, which is also slanted, so that all of the butt edges SK that form the border areas between chip, frame structure, and cover at the chip side edges are covered by the back face metallization RM. At least one interfacial connection is guided through the cover, and provided on the inside surfaces with an underside metallization UM. This connects a connector metallization AM on the chip with an underside contact UK on the underside of the cover AD. The connector metallization AM is connected with the component structures BS, in electrically conductive manner. All of the surfaces of the component therefore either consist of cover AD, which consists of a diffusion-proof material, or are covered with a metallization, which is also extremely sealed against diffusion. This has the result that the cavity in which the component structures are disposed is hermetically sealed against the outside world.

The chip comprises, for example, a semiconductor material such as Si, SiGe, or a III/V connection semiconductor such as GaAs, InP, InSb, etc.

Piezoelectric materials such as quartz ($SiO_2$), lithium niobate ($LiNbO_3$), lithium tantalate ($LiTaO_3$), lithium tetraborate ($Li_2B_4O_7$) langasite ($La_3Ga_5SiO_{14}$), berlinite ($AlPO_4$), gallium orthophosphate ($GaPO_4$), zinc oxide (ZnO), gallium arsenide (GaAs), etc., or layers thereof on substrate wafers, are also suitable as base materials for the chip.

The component structures BS can be configured as electrical conductors, micromechanical or micro-optic structures, or as sensors.

Figure 2:
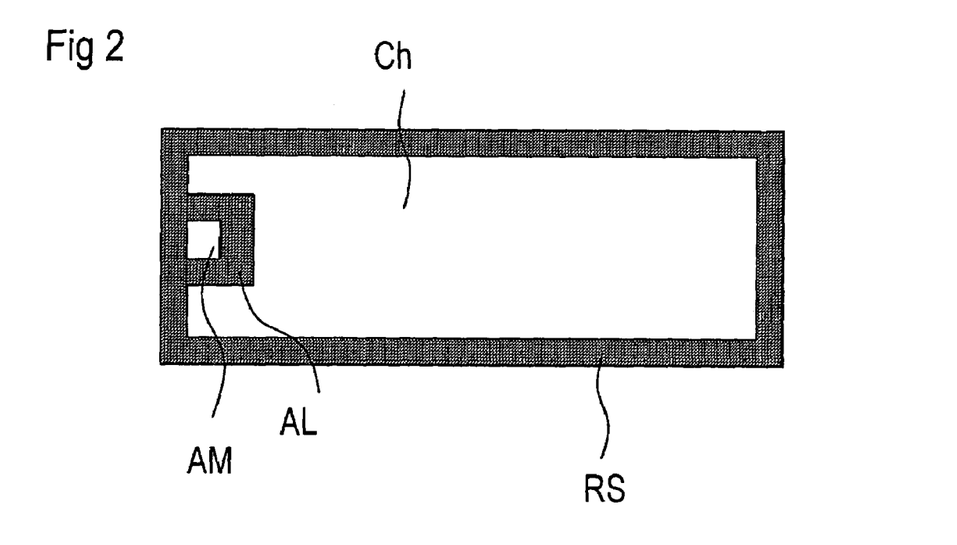
FIG. 2 shows a schematic top view of the chip front face.

FIG. 2 shows the arrangement of the frame structure RS, in a schematic top view of the front face of the chip CH. The structure is closed in a ring shape in the outside region of the chip surface. In the embodiment shown here, the frame structure has a branch AL, which is also closed in ring shape, which surrounds another, smaller region within the frame structure. This is the region also shown in FIG. 1, in which the interfacial connection is provided, so that there, the underside metallization UM can enter into contact with the connector metallization. The connector metallization is connected with the component structures BS in electrically conductive manner.

Figure 3:
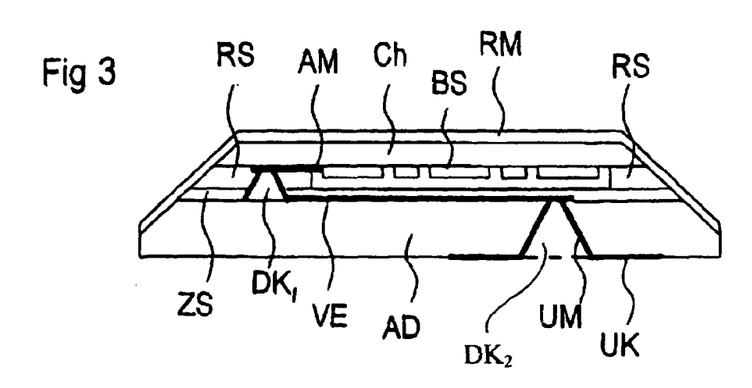
FIG. 3 shows a cross-section through another component having an intermediate layer.

FIG. 3 shows another embodiment of a component according to the invention, in which an intermediate layer between frame structure and cover AD is disposed in addition to the frame structure in FIG. 1. In the case shown, the cavity for the component structures is created between intermediate layer ZS and chip CH. In this connection, the frame structure RS serves as a spacer. Another wiring level VE is provided between the intermediate layer ZS and the cover AD, in which electrical connections or concrete passive components can be disposed. The wiring level VE is connected with the connector metallization AM on the surface of the chip CH by way of an interfacial connection $DK_1$. The wiring level VE is connected with the underside contact UK on the underside of the cover AD by way of the underside metallization UM of another interfacial connection $DK_2$.

This embodiment has the advantage that parallel to the surface that is provided for the component structures BS, a different level is utilized for wiring, i.e., switching. This allows a further reduction in the footprint required for the component. The interfacial connection $DK_2$ from the underside of the cover AD to the wiring level VE can be carried out more simply and more non-critically with regard to adjustment than an interfacial connection that leads from the underside to the chip front face, such as that shown in FIG. 1, for example. This facilitates production.

Figure 5:
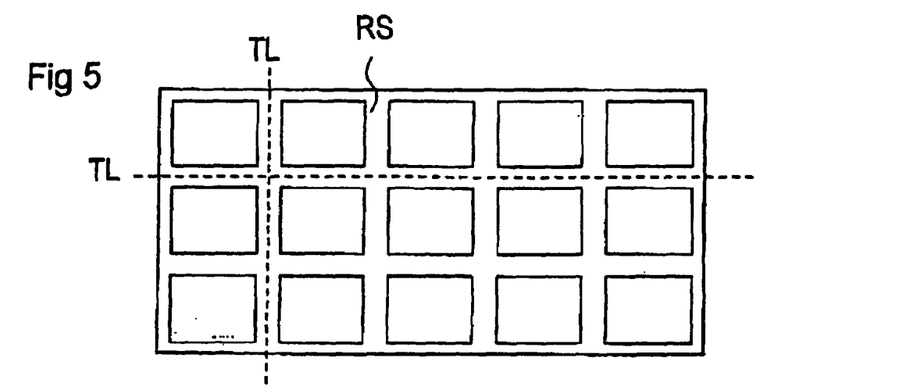
FIG. 5 shows a wafer with a frame structure applied to it, in a top view.

For efficient production of components according to the invention, work starts on the wafer level. FIG. 5 shows details of the surface of a wafer W already provided with component structures (not shown in the figure), onto which a frame structure RS is applied. The frame structure RS is structured in such a manner that the component structures that are provided for an individual component are surrounded in ring shape by the partial structure of the frame structure. The later division into individual components subsequently takes place along separation lines TL, of which, for reasons of clarity, only two are shown in the figure. The separation lines run along structures of the frame structure, specifically in such a manner that during division into individual components, frame structures closed in ring shape remain on each individual component. The frame structure is preferably applied to the front face of the wafer, or alternatively, on the top of the cover. The frame structure can be applied to the entire area at first, and can then be structured. An appropriate film can be laminated on when applying the layer over the entire area. It is also possible to spin on or print on a layer over the entire area. It is also possible to apply the frame structure in structured manner, for example by laminating on a structured film, or by printing it on. It is also possible to apply a roughly structured layer for the frame structure RS at first, and to microstructure it later.

For structuring, it is possible to adjust the material for the frame structure RS to be photosensitive, to expose it by way of a mask or scanning, and subsequently to develop it. It is also possible to laminate on a dry resist film, to expose it, and subsequently to develop it. It is also possible to structure a layer that cannot be photo-structured, using a resist mask, and subsequent wet chemical etching or plasma etching. Another possibility is to microstructure a layer for the frame structure, which has been applied over the whole area, or has been roughly pre-structured, by means of microablation.

Not shown in FIG. 5 are branches of the frame structure or islands. The branches surround the regions of the surface of the wafer in a ring shape, as shown in FIG. 2 for an individual component, in which contacts to the contact metallization AM are provided.

Figure 4:
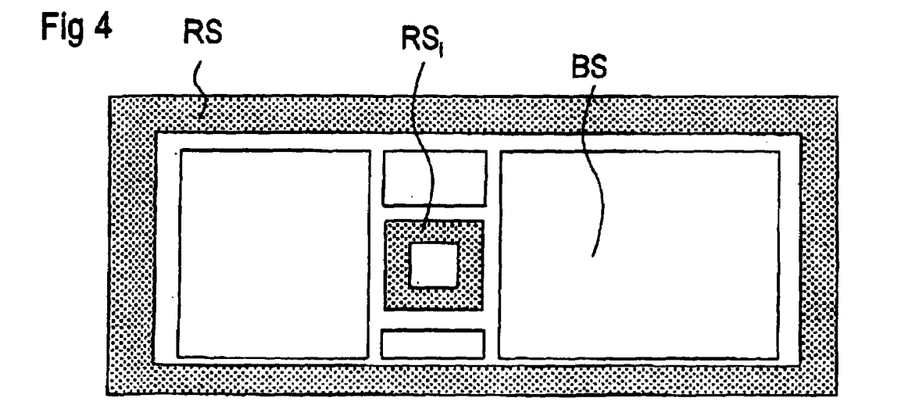
FIG. 4 shows another schematic top view of a chip front face.

FIG. 4 shows such an island-shaped additional frame structure $RS_i$, which is produced together with the frame structure RS. The component structures BS are indicated schematically in the figure, by means of the area that can be occupied by the component structures. Within the island-shaped frame structure RS, an interfacial connection can create contact to the connector metallization on the surface of the chip or wafer.

After the frame structure has been produced either on the wafer W or on the cover AD, in structured manner, the sandwich-like structure can be produced by means of gluing, for example in that the cover AD is glued together with the frame structure that has already been produced on the chip front face, or the chip or wafer is glued to the frame structure RS that has been applied to the cover. The height of the frame structure is adjusted in such a manner that it is clearly higher than the height of the component structures. In this manner, it is guaranteed that the component structures BS are disposed in the cavity surrounded by the frame structure, at a distance from the cover AD.

Figure 6:
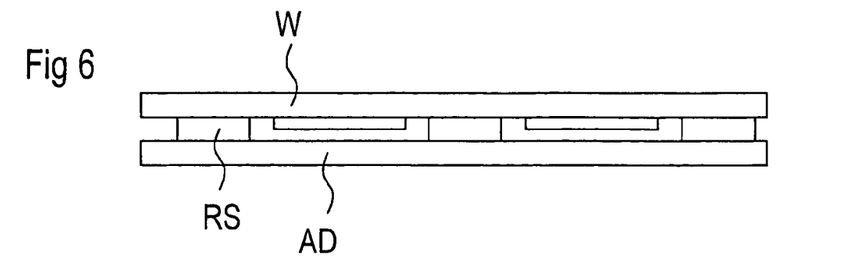
FIG. 6 shows a sandwich-like structure consisting of a wafer, a frame structure, and a cover.

FIG. 6 shows the arrangement after gluing, in details, using a schematic cross-section that comprises two individual components.

If, as was already explained using FIG. 3, an intermediate layer ZS is supposed to be produced to accommodate an additional wiring level VE, this can fundamentally be achieved using a method called PROTEC, as it is described in EP0759231B1, for example; reference is hereby made to its complete content.

In DE 100 064 46 A1, another solution that can be used according to the invention is proposed. It comprises laminating a very thin ancillary film onto a frame structure, over a cavity, applying a reaction resin that can be processed in liquid form, and structuring the resin layer and the ancillary film, wherein the removal of the ancillary film, which is exposed above contact holes, for example, can take place by means of solvents or plasma.

According to the invention, it is furthermore proposed to apply a polymer that can be photo-structured onto an ancillary film. For this purpose, the ancillary film can be clamped into a device. Suitable films are available in good mechanical and optical grades, in thicknesses to below 1 μm (e.g., capacitor films). The layer, which is viscous at first, can be adjusted in a broad range between gel-like and solid/tacky, by means of heat processes. In this state, the layer, together with the ancillary film, can be laminated onto the frame structure and can be photo-structured through the ancillary film, which is then transparent. The ancillary film is then completely removed in simple manner, for example during the subsequent development process. The structured and cured polymer remains, which can now form the intermediate layer and thereby can offer an additional area for the production of a wiring level.

Alternatively, the intermediate layer can also be implemented by means of gluing a film, a polymer film, or a thin glass layer onto the first layer, over the entire area, and subsequent photo-structuring.

Contact areas, for example in the form of solder pads or bumps, can be applied directly to the covering.

The additional wiring level VE can also be applied on the surface of the frame structure RS that faces the cover. For this purpose, the frame structure is first produced on the wafer W and structured. Subsequently, the component structures are covered with a protective cover, for example with a protective varnish. Subsequently, the metallization for the wiring level is produced, for example by means of metallization over the entire area, and subsequent structuring of the latter. In the next step, the protective varnish is removed. An interfacial connection from the underside of the cover to the wiring level on the frame structure then no longer has to be guided to the surface of the wafer. This again saves area space and allows a more precise adjustment of the interfacial connection.

The cover is now glued onto the intermediate layer that has been prepared in this manner, or onto the frame structure, as in FIG. 6. Here again, the surface can first be roughened over the entire area or locally, in order to improve adhesion.

For gluing, the application of adhesive can take place over the entire area or selectively—in the shape of the frame structure—onto the cover and/or the intermediate layer, or, in the case of a cover provided with the frame structure, onto the wafer. Preferably, the adhesive is made of the same or a similar material as the frame structure. It is also possible to use a frame structure that is still sufficiently tacky for gluing, or to thermally soften the latter, or partially dissolve it, or otherwise make it tacky, for this purpose.

The adhesive can be applied in a layer thickness so that it achieves a layer height of 0.2 to 20 μm in the cured state. The application can take place on one or also on both joining surfaces. If the cover is selected for this purpose, the application of adhesive can take place in structured manner, in accordance with the frame structure of the wafer, or also in simple manner, over the entire area.

Curing of the adhesive will preferably take place at temperatures that are not too high, since otherwise, because of the mismatch between the thermal expansion coefficients of wafer and cover, as mentioned, which can hardly be avoided, displacements will occur (during heating) and distortion will occur (during cooling). At a room temperature of 25° C., for example, the curing temperature should therefore not exceed 50° C.

Therefore, a radiation-cured adhesive (VIS or UV) with open pre-activation (especially in the case of a non-transparent cover) or irradiation through the cover (if the latter is sufficiently permeable for the wavelengths used) is particularly suitable. In each case, a cold-curing adhesive can also be used, which is activated by means of being mixed from its components.

If the aforementioned mismatch is sufficiently minimized, a heat-curing adhesive can also be used, of course. Then, however, it is advantageous to use the material of the wafer for the cover.

In an important case, however, a mismatch is desirable, specifically if the temperature coefficient of a specified characteristic (for example the center frequency of a SAW filter) is disadvantageously great because of the crystallographic wafer properties. According to the invention, a positive lock connection with a cover having suitable thermal expansion behavior can be used in targeted manner, to reduce the expansion coefficient of the component.

Figure 7:
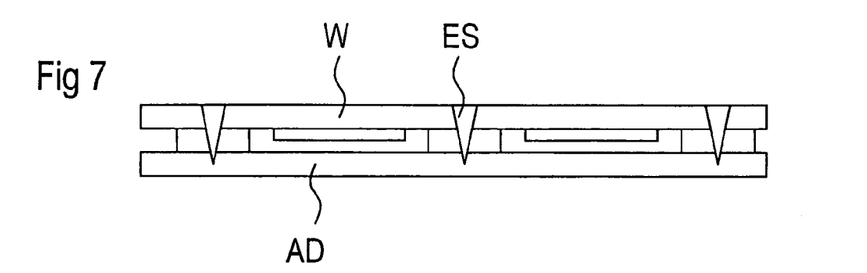
FIG. 7 shows the structure after the production of wedge-shaped cuts into the chip.

FIG. 7: In the next step, wedge-shaped cuts ES are produced in the back face of the wafer, along the separating lines TL. The cuts ES are made so deep that they reach into the cover AD. The cuts divide the individual structures of the frame structure in the center, without opening up the cavity that has been created for the component structures BS.

The cuts ES can be produced by means of sawing, grinding, sandblasting, wet etching, dry etching, ultrasound erosion, or with a laser. They are produced either with perpendicular walls having a depth to width ratio≦3, as walls inclined in V shape, with an opening angle up to 150° (preferably 30°–90°), or as U-shaped cuts. In order to create better prerequisites for the subsequent metallization, a V-shaped sawed profile is preferred if the ratio of depth to width of the cuts exceeds a value of approximately 1–2.

If an electrical connection of the back face metallization to a conductor of the wiring level is supposed to take place, in order to connect the back face metallization with ground, for example, and thereby achieve electromagnetic shielding of the component, the cut must have at least one cut edge with this conductor.

Before or after production of the cuts, it is possible to reduce the thickness of the wafer from the back. In this arrangement, it can be ground down to a layer thickness of approximately 50 µm, or ablated in some other way. The firm connection with the frame structure and the cover assures sufficient mechanical stability in spite of the low layer thickness so that the components are not damaged and their operability is not impaired.

Figure 8:
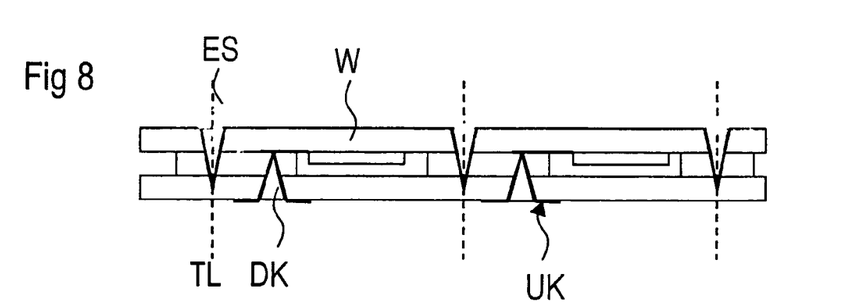
FIG. 8 shows the structure after the production of the back face and underside metallization.

In the next step, a back face metallization is applied to the back face of the wafer W, which has been provided with the cuts ES, in a total thickness of 10 to 20 µm, for example. Preferably, PVD or CVD methods are used for this purpose, possibly in combination with galvanics. The metallization can comprise a layer structure that contains Ti, W, V, Cr, Cu, Al, Ag, Sn, Pt, Pd, Au and/or Ni, or any desired layers or alloys of them, with a total thickness of 1–30 µm. In a preferred exemplary embodiment, an adhesion layer is sputtered on, having a thickness≦2 µm (Ti, W, V, Ni and/or Cr), followed by an electrochemical thickening with 5–30 µm Cu, for example. Subsequently, 0.05–5 µm Ag, Pd, Ni and/or Au are applied to the surface.

In a prior or subsequent step, the interfacial connections DK through the cover AD are produced.

For all the interfacial connections, it holds true that they are preferably produced with a conical cross-section, wherein the greater cross-section of the conical opening faces outward, so that the production of a sealed and continuous metallization is facilitated. These holes can be drilled both before and after gluing, in the case of all the method variants listed as examples. If this occurs afterwards, an end or a slow-down of the process can be advantageously achieved as soon as the break-through has occurred, in that wear rates of different degrees are used, or the work is performed with reproducible stops, or the penetration into the next layer is reliably detected and the processing then stops.

The following methods can be used, for example:

The working depth can be controlled very accurately using an excimer laser, by means of the number and the energy of the laser pulses. Since different materials have different ablation threshold intensities, an automatic shutdown of the processing when a border surface has been reached can also be achieved.

In the case of wet etching using a photoresist mask or with photo-structured glass such as Foturan® as a cover, the selection of a selective etching agent, which essentially attacks only the glass, is advantageous.

In the case of dry etching using a photoresist mask, control by way of the process time is possible. In addition, a selectively acting plasma etching method can be selected.

In the case of drilling/grinding, the work can be carried out with depth measurement or a depth stop. Also, detection can take place using the changed body sound when the border layer is reached.

In the case of sandblasting through a resist mask, brittle materials such as glass are worked away more quickly than elastic polymers. Therefore, in the case of this method, the process almost comes to a stop at the border surface to the polymer (frame structure or intermediate layer).

In the case of ultrasound erosion with a sonotrode and abrasive material suspension, the same holds true as for sandblasting.

Subsequently, the holes for the interfacial connections are metallized on their inside surfaces. For this purpose, a metallization is produced on the underside of the cover, over the entire area, for example using a method analogous to the production of the back face metallization RM. Subsequently, the underside metallization is structured, so that an underside contact UK is formed for every interfacial connection, by way of which the component can subsequently be connected. For the sake of simplicity, only one interfacial connection is shown for every individual component.

Before or after structuring of the underside metallization, the interfacial connections can be filled with bumps. For a particularly efficient bump method, a solder mask (e.g., a dry resist film) is applied and structured. The holes in the mask, above the contact bores, define the area of the subsequent under bump metallization (UBM). They are filled with solder paste by means of screen/template printing or galvanically, or pre-finished solder beads are introduced. After melting, the solder mask is removed and the exposed copper is etched away, the solder bump serving as an etch resist for the UBM.

In an embodiment according to the invention, the bump is formed in that a solid or hollow bead (diameter 30 to 300 µm) is partially pressed into the metallized bore for the interfacial connection. Possible materials for the solid or hollow bead are glass, ceramic, metal, or polymers; the latter are preferred because of their flexibility. In the case of non-conductive materials, the surface of the bead can be metallized. To improve the mechanical and electrical connection, a galvanic metal coating that can be soldered subsequently takes place, which connects the exposed metallization collar of the bore of the interfacial connection and the exposed sphere segment in gas-tight manner.

For other bump methods, which have already been proposed in great numbers, direct photo-technical structuring of the underside metallization, which particularly comprises copper, takes place. Now solder beads can again be inserted into the holes and melted, for example.

Figure 9:
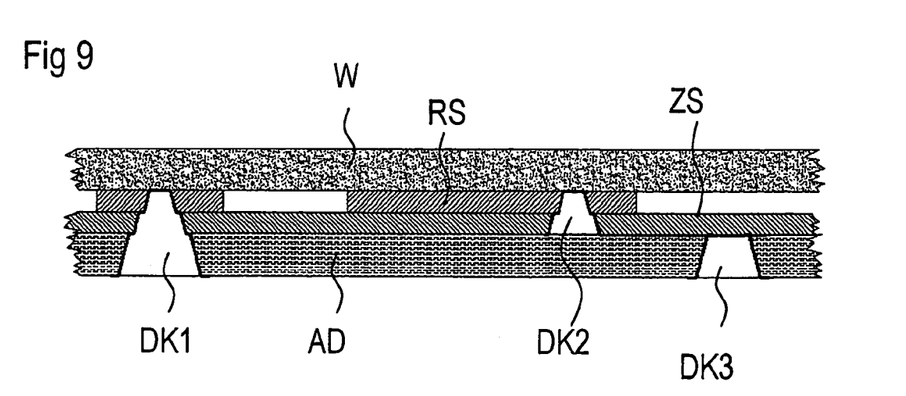
FIG. 9 shows several types of possible interfacial connections, using a schematic cross-section.

FIG. 9 shows the possibility of providing different interfacial connections, using a schematic cross-section through a sandwich-like structure. The interfacial connection DK1 shown in the left in the figure connects an underside contact UK1 with the surface of the wafer W. An intermediate layer ZS is disposed between frame structure RS and cover AD, so that a cavity is formed between wafer and intermediate layer ZS, in which the component structures (not shown in the drawing) are disposed in contact-free manner, without contact with the intermediate layer. On the surface of the intermediate layer (between cover and intermediate layer), another wiring level VE is disposed, which is connected with the surface of the wafer, i.e., with a connector metallization present there, by way of an interfacial connection DK2.

Another interfacial connection DK3 connects the underside contact UK3 with the wiring level VE. As is already evident from the figure, additional area is created in the component, with the additional wiring level. In addition, the interfacial connection DK2, in particular, can be positioned more precisely and adjusted relative to the component structures, i.e., their contact metallizations. For the interfacial connection DK3, it holds true that its positioning can now take place with greater tolerance, wherein the interfacial connection DK3 can also be implemented with a larger opening, without thereby increasing the area required for the component.

Another possibility for producing the additional wiring level consists of disposing it on the top of the cover, particularly opposite the component structures within the cavity. In this case, an interfacial connection still has to be made, in order to produce a contact between the connector metallization on the surface of the wafer and the wiring level on the top of the cover. In order to produce the interfacial connection, the method just described, using a protective varnish above the component structures, can be used.

Since it was possible to show the invention only on the basis of a few exemplary embodiments, it is not limited to the precise configuration according to these embodiments and the related figures. Variations are possible, particularly with regard to the spatial configuration of the components, the number of intermediate layers and interfacial connections, as well as the location of the interfacial connections. The back face metallization can be partially removed from the back face of the wafer/chip. A cavity for the component structures is not absolutely necessary. If the component structures are sufficiently non-sensitive, it is also possible that the cover or the intermediate layer rests directly on the front face of the chip/wafer. This is particularly true for purely microelectronic components.

The invention claimed is:

1. A component comprising:
   a chip having a first chip face and a second chip face, the first chip face comprising component structures and connector metallizations associated with the component structures;
   a frame structure on the first chip face and adjacent to the component structures;
   a cover over the frame structure, the cover having a first cover face and a second cover face, the first cover face being closer to the chip than the second cover face;
   a back metallization that is on the second chip face, on sides of the frame structure, and on sides of the cover;
   a contact on the second cover face; and
   a connection through the cover, the connection electrically connecting the component structures and the contact;
   wherein the connection is metallized and sealed.

2. The component of claim 1, wherein the chip and the cover define a cavity that contains the component structures.

3. The component of claim 1, wherein the frame structure comprises one or more interior structures that define one or more enclosures within the frame structure, the one or more enclosures exposing the connector metallizations.

4. The component of claim 1, further comprising wiring adjacent to the first cover face, the wiring being connected to the connector metallizations and to the connection.

5. The component of claim 1, further comprising, between the cover and the frame structure:
   at least one intermediate layer; and
   wiring adjacent to the first cover face.

6. The component of one of claims 4 or 5, wherein the wiring comprises metal structures comprising at least one of conductors and passive components, the passive components comprising at least one of capacitors, inductors, and resistors.

7. The component of claim 1 wherein the cover comprises one of ceramic, metal, and glass; and
   wherein the frame structure comprises one of benzocyclobutene, polyimide, and benzoxazol.

8. The component of claim 1 wherein the component is at least one of a microelectronic component, a surface wave component, an FBAR resonator, a micro-optic component, a micromechanical component, and a hybrid component.

9. The component of claim 2, wherein the cavity contains a protective gas having a spark-over resistance that is different from a spark-over resistance of air.

10. The component of claim 1, wherein the connection is conical in shape.

11. A method of producing encapsulated components, comprising;
    adding component structures to a first face of a wafer;
    applying a frame structure to the first face of the wafer, the frame structure surrounding the component structures;
    adhering a cover to the frame structure thereby forming a cavity between the cover and the wafer, the component structures being inside the cavity, wherein the cover comprises a first cover face and a second cover face, the second cover face being nearer to the wafer than the first cover face, the first cover face comprising a contact, and wherein the cover comprises a connection that electrically connects the component structures to the contact, the connection being sealed with a diffusion-proof underside metallization;
    forming cuts in a second face of the wafer that does not include the component structures, the cuts passing through the frame structure and into the cover, wherein the second face of the wafer, comprises metallization; and
    separating the wafer into individual components along the cuts.

12. The method of claim 11, further comprising:
    applying an intermediate layer, the intermediate layer being between the frame structure and the cover; and
    adding wiring to the intermediate layer, the wiring being connected to a metallization on the wafer via the connection.

13. The method of claim 12, wherein the intermediate layer comprises a cover film that is glued to the frame structure.

14. The method of claim 13, wherein applying the intermediate layer comprises:
    applying the cover film and an ancillary film, to the frame structure;
    structuring the cover film; and
    removing the ancillary film.

15. The method of claim 14, wherein the cover film is applied to the ancillary film as a reaction resin in viscous form, and wherein structuring comprising laminating and curing.

16. The method of claim 11, wherein applying the frame structure comprises shaping the frame structure.

17. The method of claim 12, wherein the frame structure and/or the intermediate layer (ZS) are applied via photo-structuring, etching using a resist mask, or laser ablation.

18. The method of claim 11, further comprising:

forming the metallization and the diffusion-proof underside metallization by sputtering; and reinforcing the metallization and the diffusion-proof underside metallization via wet chemistry or galvanization.

19. The method of claim 18, wherein the metallization is formed over an entire area of the second surface of the wafer; and wherein forming the metallization and/or the diffusion-proof underside metallization comprises structuring the metallization and/or the diffusion-proof underside metallization.

20. The method of claim 12, further comprising:

applying a protective coating to the component structures before the wiring is added; and removing the protective coating after the wiring is added.

21. The method of claim 11, further comprising:

roughening a surface of the wafer at a contact point with the frame structure prior to applying the frame structure.

22. The method of claim 12, wherein applying the intermediate layer comprises shaping the intermediate layer.

* * * * *